(12) United States Patent
Onozaki et al.

(10) Patent No.: US 7,350,686 B2
(45) Date of Patent: Apr. 1, 2008

(54) METHOD FOR SUPPLYING SOLDER

(75) Inventors: Junichi Onozaki, Tokyo (JP);
Masahiko Furuno, Tokyo (JP); Hiroshi Saito, Tokyo (JP); Haruhiko Andou, Tokyo (JP); Isao Sakamoto, Tokyo (JP); Masaru Shirai, Tokyo (JP); Yuji Ohashi, Saitama (JP)

(73) Assignees: Tamura Corporation, Tokyo (JP); Japan Science and Technology Agency, Saitama (JP)

( * ) Notice: Subject to any disclaimer, the term of this patent is extended or adjusted under 35 U.S.C. 154(b) by 0 days.

(21) Appl. No.: 10/530,548

(22) PCT Filed: Dec. 13, 2002

(86) PCT No.: PCT/JP02/13057

§ 371 (c)(1),
(2), (4) Date: Apr. 7, 2005

(87) PCT Pub. No.: WO2004/054339

PCT Pub. Date: Jun. 24, 2004

(65) Prior Publication Data
US 2006/0054667 A1   Mar. 16, 2006

(30) Foreign Application Priority Data
Dec. 6, 2002 (JP) .............................. 2002-355373

(51) Int. Cl.
*B23K 31/02* (2006.01)

(52) U.S. Cl. ...................................... 228/256; 228/257

(58) Field of Classification Search ................ 228/259, 228/257
See application file for complete search history.

(56) References Cited

U.S. PATENT DOCUMENTS

5,125,560 A * 6/1992 Degani et al. ............... 228/223
5,736,074 A * 4/1998 Hayes et al. .................... 264/6
5,880,017 A * 3/1999 Schwiebert et al. ......... 438/613

(Continued)

FOREIGN PATENT DOCUMENTS

DE    4432774 A1 *   3/1996

(Continued)

OTHER PUBLICATIONS

English Language Abstract of JP 8-64943.

(Continued)

*Primary Examiner*—Kiley Stoner
(74) *Attorney, Agent, or Firm*—Greenblum & Bernstein, P.L.C.

(57) ABSTRACT

Obtained are fine-pitched pad electrodes and also solder bumps with a large amount of solder and a less difference in the amount. First, in an inert liquid in a liquid tank, a substrate is positioned with a surface facing up. Subsequently, the inert liquid containing solder fine particles is fed from a solder fine particle forming unit to the liquid tank and the solder fine particles are dropped from a supply pipe onto the substrate in the inert liquid. The solder fine particles naturally fall down by the gravity, thereby reaching the substrate. The solder fine particles reached on the pad electrodes on the substrate stay there due to the gravity, and spread on the surfaces of the pad electrodes after the solder wet time, thereby forming solder coating.

8 Claims, 4 Drawing Sheets

U.S. PATENT DOCUMENTS

| | | | | |
|---|---|---|---|---|
| 6,070,788 | A | * | 6/2000 | Zakel .......................... 228/214 |
| 6,109,175 | A | * | 8/2000 | Kinoshita .................... 101/170 |
| 6,467,671 | B1 | * | 10/2002 | Unagami .................... 228/20.1 |
| 2007/0158387 | A1 | * | 7/2007 | Shirai et al. ................. 228/101 |

FOREIGN PATENT DOCUMENTS

| | | |
|---|---|---|
| GB | 2113720 | 8/1983 |
| GB | 2173136 | 10/1986 |
| JP | 2-012830 | 1/1970 |
| JP | 3-226365 | 10/1991 |
| JP | 7-114205 | 5/1995 |
| JP | 8-64943 | 3/1996 |
| JP | 10-505711 | 6/1998 |
| JP | 3434829 B2 * | 8/2003 |
| KR | 10-0270837 | 11/1997 |
| KR | 10-0269834 | 7/2000 |
| WO | 96/08337 | 3/1996 |

OTHER PUBLICATIONS

English Language Abstract of KR 10-0270837.
English Language Abstract of JP 3-226365.
English Language Abstract of JP 2-012830.
English Language Abstract of JP 7-114205.

* cited by examiner

FIG. 2
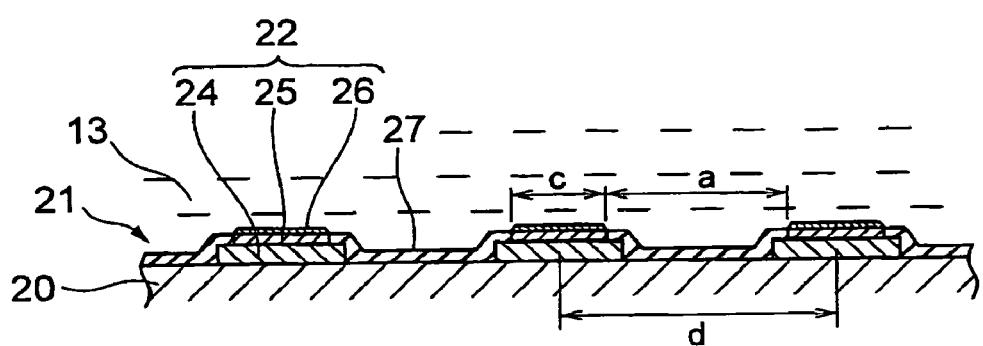
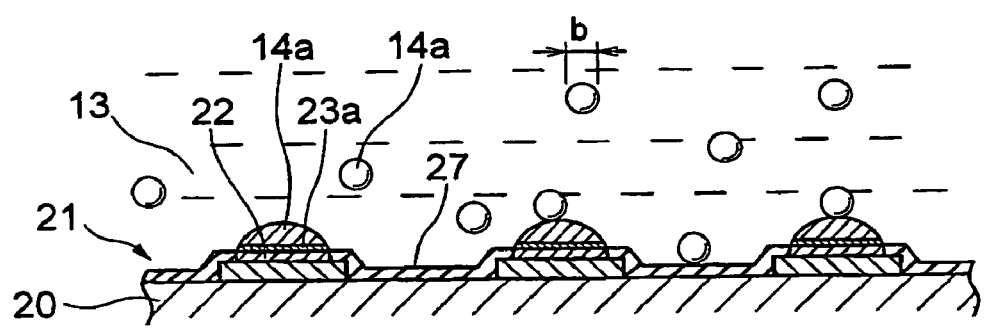
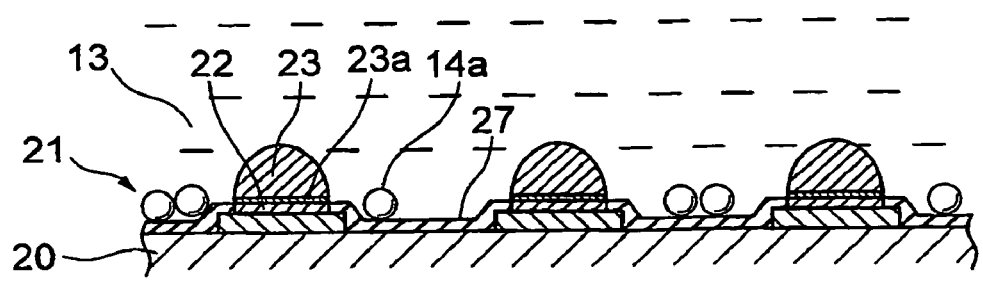

PRIOR ART

… (1/2) …

METHOD FOR SUPPLYING SOLDER

TECHNICAL FIELD

The present invention relates to a solder supplying method which is, for example, used when manufacturing FC (flip chip) and BGA (ball grid array) by forming hemispherical solder bumps on a semiconductor substrate and on an interposer substrate, and to a method and an apparatus for forming solder bumps using the same.

BACKGROUND ART

In recent years, a high density mounting technology of electronic components has been making a rapid progress in accordance with miniaturization and thinning of electronic devices. FC and BGA with the hemispherical solder bumps are used as semiconductor devices for achieving the high density mounting.

As a method for forming solder bumps on pad electrodes, generally used are a method in which pad electrodes are made to be in contact with molten solder (molten solder method), a method in which solder paste is screen-printed on pad electrodes and is re-flown (screen printing method), a method in which solder balls are mounted on pad electrodes and are re-flown (solder ball method), a method in which solder plating is applied on pad electrodes (plating method), etc. In addition, there is another known method for forming solder bumps as disclosed in Japanese Patent Unexamined Publication No. 7-114205 (FIG. 1, etc), for example.

FIG. 4 is a schematic cross section for showing the forming method disclosed in Japanese Patent Unexamined Publication No. 7-114205. It will be described in the followings by referring to the drawing.

In this forming method, first, in an inert solvent 80 which is heated to be hotter than a melting point of solder, a wafer 82 having copper electrodes 81 on a surface is immersed with the surface facing down. Then, in the inert solvent 80, solder particles 84 made of molten solder 83 are emitted upwards. Thereby, solvent bumps (not shown) are formed on the copper electrode 81 by making the solder particles 84 come in contact with the wafer 82. It will be described in more detail.

The molten solder 83 and the inert solvent 80 inside a heat tank 85 are controlled to be at temperatures slightly higher than a melting point of solder, for example, at 200° C. The molten solder 83 inside the heat tank 85 is sucked into a solder-fine-particle forming unit 87 through a solder intake pipe 86. Further, the solder-fine-particle forming unit 87 sucks the inert solvent 80 which is at the same temperature as that of the molten solder 83 through an inert solvent intake pipe 88 and mixes/agitates these two liquids for breaking the molten solder 83 so as to have it pulverized. Then, the inert solvent 80 containing the solder particles 84 is transferred to an ejection unit 90 through a mixed-solution outlet pipe 89 to be emitted upwards from nozzles 91.

The solder particles 84 in the inert solvent 80 are coated by the inert solvent 80 so that they are not to be exposed to the open air. Thus, the surfaces of the solder particles 84 maintain the metal surfaces to be in an active state. The solder particles 84 in the inert solvent 80, when in contact with the surface of the immersed wafer 82, form a solder alloy layer together with the copper electrodes 81 and stick to the surfaces thereof. Thereby, the surfaces of the copper electrodes 81 are covered by the molten solder coating (not shown). Subsequently, since the solder particles 84 are easily adsorbed to the solder coating so that the solder particles 84 in this part are stuck onto the solder coating one after another.

In the meantime, the solder particles 84 which do not stuck onto the copper electrodes 81 gradually fall down due to the specific gravity difference and deposit in the bottom of the heat tank 85. As described above, by immersing the wafer 82 with the copper electrodes 81 facing down in the inert solvent 80 where the solder particles 84 are emitted upwards, the solder bumps (not shown) can be selectively formed on the surfaces of the copper electrodes 81.

However, in the molten solder method, there is such a drawback that there is a small amount of the solder in the solder bumps and the difference in the amount is large, while it is suitable for achieving fine pitch of the pad electrodes. In the silk screen printing method, it is not suitable for achieving the fine pitch since it is likely to cause clogging and uneven solder amount when using a mask with the fine pitch, while it enables to easily form the solder bumps collectively. In the solder ball method, as the recent trend, the number of solder balls used in a single semiconductor device is extremely large and, in addition, the size of the solder balls are extremely small so that it increases the manufacturing cost. In the plating method, there is no plating liquid appropriate for lead-free solder which has recently come into use. In the forming method as disclosed in Japanese Patent Unexamined Publication No. 7-114205, there is such a drawback that the solder particles are not easily stuck to the copper electrode, i.e. the solder wetability is not great, so that it is difficult to put it into practical use.

Therefore, the object of the present invention is to provide a solder supplying method, which enables to achieve fine-pitched pad electrodes and also to obtain solder bumps with a large amount of solder and a small difference in the amount thereof, and to provide a method and an apparatus for forming the solder bumps using the same.

DISCLOSURE OF THE INVENTION

The solder supplying method according to a first aspect of the present invention is a method in which solder coating is formed on a metal film through positioning a substrate having the metal film on a surface with the surface facing up in a liquid which is heated to be hotter than a melting point of solder and dropping solder fine particles made of the melted solder on the substrate in the liquid. The "solder" herein is not limited only to the solder for forming solder bumps but also includes solder for die-bonding semiconductor chips and "soft solder" and the like used for, for example, bonding copper pipes. Naturally, it also includes lead-free solder. It is preferable that the "liquid" used herein be an inert liquid which does not react to the solder and a liquid (for example, an organic acid and the like to be described later) which has an effect of removing an oxide film on the surface of the solder. The "solder coating" herein is not limited only to a film type but also includes a hemispherical type and a protrusion type.

In the liquid, the substrate is immersed with the metal film side facing up. At this time, when the solder fine particles are supplied into the liquid above the substrate, the solder fine particles naturally fall down due to the gravity, thereby reaching on the substrate. The solder fine particles fallen onto the metal film of the substrate stay there by the gravity and then spread on the metal film surface after "a certain time", so as to form the solder coating. Subsequently, the solder fine particles reached on the solder coating stay there by the gravity and spread as well after "a certain time, thereby thickening the solder coating. This action is repeated and the solder coating is grown.

The Inventor of the present invention has found out that it requires "a certain time" (referred to as "solder wet time" hereinafter) as described above for the solder to be wet. In the art disclosed in Japanese Patent Unexamined Publication No. 7-114205, the solder fine particles are emitted towards the pad electrodes facing downwards for making them come in contact, so that the time for the solder fine particles to be in contact with the pad electrodes is only a moment. Therefore, it is considered that the solder wetability is not good.

Further, in the art of Japanese Patent Unexamined Publication No. 7-114205, the solder fine particles are emitted against the gravity so that it requires a considerable amount of energy. On the contrary, in the present invention, the solder fine particles are only left to naturally fall down so that it requires almost no energy. The art of Japanese Patent Unexamined Publication No. 7-114205 can be considered as a kind of jet soldering. Meanwhile, the present invention is completely a new technique which does not belong to any of the conventional soldering methods.

The Inventor of the present invention also found out that there are not many solder fine particles which are combined for forming larger solder fine particles, even if the solder fine particles come in contact with each other in the liquid. Therefore, the solder bridges and the like are not generated even in the metal films with the fine pitch. Further, the solder amount of the solder coating can be easily controlled by changing the supply amount of the solder fine particles. Moreover, since the solder fine particles are extremely small, a large amount can be supplied so that they can be uniformly dispersed in the liquid. Therefore, the difference in the solder amount in the solder coating becomes small.

The solder supplying method according to a second aspect of the present invention is the method in which the solder fine particles, which are dropped and come in contact with the metal film or the solder coating, are kept for a certain time in that state until solder wet is caused in the solder supplying method the first aspect of the present invention. "A certain time until the solder wet is caused" is the solder wet time described above. Thus, it is possible to surely cause the solder wet by keeping the solder fine particles in contact with the metal film or the solder coating in that state for the solder wet time or longer. The "solder wet" herein is not limited to forming the solder coating formed on the metal film surface by spread of the solder fine particles reached on the metal film but also includes thickening of the solder coating by spread of the solder fine particles reached on the solder coating.

The solder supplying method according to a third aspect of the present invention is the method in which the solder fine particles to be dropped on the substrate is limited to the ones whose falling speed is within a specific range in the solder supplying method the first or second aspects of the present invention. As for the solder fine particles in the liquid, the larger ones are faster in the falling speed and the smaller ones are slower in the falling speed. Meanwhile, when the size of the solder fine particles is large, it is likely to generate the solder bridge. When the size of the solder fine particles is small, the surface is easily oxidized. Therefore, by selecting the solder fine particles with the falling speed within a specific range, it enables to suppress the generation of the solder bridges and deterioration of the solder wetability by the oxide film. Specifically, it can be achieved by dropping a large amount of the solder fine particles all at once, and by retreating the substrate or covering the substrate with a shutter at the time when the larger solder fine particles fall in the vicinity of the substrate and when the smaller solder fine particles fall in the vicinity of the substrate so that the solder fine particles do not reach the substrate.

The solder bump forming method according to a fourth aspect of the present invention is the method for forming a solder bump on a pad electrode through: positioning a substrate having the pad electrode on a surface with the surface facing up in a liquid which is heated to be hotter than a melting point of solder; supplying solder fine particles made of the solder being melted into the liquid; and dropping the solder fine particles on the substrate. The "substrate" herein includes a semiconductor wafer, a wiring board, and the like. Further, the "solder bump" is not limited to the ones of a hemispherical type or a protrusion type but also include a film type.

In the liquid, the substrate is immersed with the pad electrode side facing up. At this time, when the solder fine particles are supplied into the liquid over the substrate, the solder fine particles naturally fall down due to the gravity, thereby reaching the substrate. The solder fine particles fallen onto the pad electrode of the substrate stay there by the gravity and then spread on the surface of the pad electrode after the solder wet time, so as to form the solder coating. Subsequently, the solder fine particles reached on the solder coating stay there by the gravity and spread as well after the solder wet time, thereby thickening the solder coating. This action is repeated and the solder coating is grown to be the solder bump.

As described above, the Inventor of the present invention has found out that there are not many solder fine particles which are combined for forming larger solder fine particles, even when the solder fine particles come in contact with each other in the liquid. Therefore, the solder bridges and the like are not generated even in the pad electrodes with the fine pitch. Further, the solder amount of the solder bump can be easily controlled by changing the supply amount of the solder fine particles. Moreover, since the solder fine particles are extremely smaller than the pad electrode, a large amount can be supplied so that they can be uniformly dispersed in the liquid. Therefore, the difference in the solder amount in the solder bumps becomes small.

The solder bump forming method according to a fifth aspect of the present invention is the method in which the solder fine particles are formed by breaking the solder being melted in the liquid in the forming method the fourth aspect of the present inventions. The solder fine particles and the solder bumps are formed in a common liquid so that the forming apparatus can be simplified.

The solder bump forming method according to another aspect of the present invention is the method in which flux or an organic acid is contained in the liquid or the liquid is made of the organic acid, and the organic acid has a reduction effect which removes an oxide on a metal surface in the forming method the fourth or fifth aspects of the present invention. By the effect of the flux or the organic acid, the solder wetability in the liquid is more improved. The "flux" herein includes colophony, a surface active agent, a substance (for example, hydrochloric acid) having an effect of removing the oxide film on the solder surface and the like.

The solder bump forming method according to a further aspect of the present invention is the method in which a diameter of the solder fine particle is smaller than a shortest distance between peripheral edges of the pad electrodes adjacent to each other in the forming method according to any one of the above aspects of the present invention. In this case, the solder fine particles reached respectively on the two adjacent pad electrodes are not to be in contact with each other, so that they are not to be combined for forming the solder bridge.

The solder bump forming apparatus according to a still further aspect of the present invention may include a liquid tank and a solder fine particle supplying unit. The liquid tank encloses a liquid heated to be hotter than a melting point of solder and a substrate which has pad electrodes on a surface and is positioned in the liquid with the surface facing up. The solder fine particle supplying unit supplies the solder fine particles made of the solder being melted into the liquid and drops the solder fine particles on the substrate.

In the liquid inside the liquid tank, the substrate is immersed with the pad electrode side facing up. At this time, when the solder fine particles are supplied from the solder fine particle supplying unit into the liquid above the substrate, the solder fine particles naturally fall down by the gravity, thereby reaching on the substrate. The same effects as those in the forming method according to the fourth aspect of the present invention can be achieved hereinafter.

The solder bump forming apparatus according to another aspect of the present invention is the apparatus in which the solder fine particle supplying unit forms the solder fine particles through breaking the solder being melted in the liquid in the forming apparatus. The same effect as those in the forming method according to the fifth aspect of the present invention can be achieved.

The solder bump forming apparatus according to yet another aspect of the present invention is the apparatus in which the liquid tank and the solder fine particles supplying unit have the following configurations. The liquid tank includes a first liquid tank for enclosing the substrate and the liquid and a second liquid tank for enclosing the liquid and the solder being melted and sunk in the liquid. Upper sections of the first liquid tank and the second liquid tank communicate with each other while bottom sections do not. The solder fine particle supplying unit forms the solder fine particles through breaking the solder being melted in the second liquid tank and supplies the solder fine particles to the first liquid tank from the upper section of the second liquid tank.

In the liquid inside the first liquid tank, the substrate is immersed with the pad electrode side facing up. At this time, the solder fine particle supplying means supplies the solder fine particles into the liquid above the substrate inside the first liquid tank from the upper section of the second liquid tank. Upon this, the solder fine particles naturally fall down due to the gravity, thereby reaching on the substrate. The solder fine particles fallen onto the pad electrodes of the substrate stay there by the gravity and then spread on the surfaces of the pad electrodes after the solder wet time, thereby forming the solder coating. Then, the solder fine particles fallen onto the solder coating stay there by the gravity and then spread as well after the solder wet time, thereby thickening the solder coating. This action is repeated and the solder coating is grown to be the solder bumps.

In the meantime, the solder fine particles which did not form the solder bumps sink in the bottom of the first liquid tank. However, since the bottom sections of the first liquid tank and the second liquid tank do not communicate with each other, the deposited solder fine particles are not to be broken so as to become the solder fine particles again. Therefore, the quality of the solder fine particles as the base for the solder bumps becomes stable and the size can be made uniform.

The solder bump forming apparatus according to a further aspect of the present invention is the forming apparatus in which the liquid tank and the solder fine particle supplying unit have the following configurations. The liquid tank includes: a first liquid tank for enclosing the substrate, the liquid and the solder being melted and sunk in the liquid; and a second liquid tank for enclosing the liquid and the solder being melted and sunk in the liquid. The upper sections and bottom sections of the first liquid tank and the second liquid tank communicate with each other. The solder fine particle supplying unit forms the solder fine particles through breaking the molten solder in the first liquid tank and the second liquid tank, supplies the solder fine particles to the first liquid tank from the upper section of the second liquid tank, and reutilizes the solder fine particles sunk in a bottom of the first liquid tank as the molten solder.

The process for forming the solder bumps by the solder fine particles is the same as the above-described forming apparatus. Meanwhile, the solder fine particles which did not form the solder bumps sink in the bottom of the first liquid tank. Then, since the bottom sections of the first liquid tank and the second liquid tank communicate with each other so that the deposited solder fine particles are broken and utilized again as the solder fine particles. Therefore, solder can be effectively utilized.

The solder bump forming apparatus according to a still further aspect of the present invention is the apparatus in which flux or an organic acid is contained in the liquid or the liquid is made of the organic acid, and the organic acid has a reduction effect which removes an oxide on a metal surface in the forming apparatus according to any one of the above-described aspects of the present invention. The same effect as those in the above-described aspects of the present invention can be achieved.

The solder bump forming apparatus according to another aspect of the present invention is the apparatus in which a diameter of the solder fine particle is smaller than a shortest distance between peripheral edges of the pad electrodes adjacent to each other in the forming apparatus according to any one of the above-described aspects of the present invention. The same effects as those in the above-described aspect of the present invention can be achieved.

BRIEF DESCRIPTION OF THE DRAWINGS

FIG. 2 are fragmentary enlarged views of FIG. 1, in which FIG. 2 to FIG. 2 correspond to FIG. 1 to FIG. 1, respectively;

BEST MODE FOR CARRYING OUT THE INVENTION

In the followings, embodiments of the present invention will be described by referring to the accompanying drawings. The solder supplying method according to the present invention is used in the method and the apparatus for forming the solder bumps according to the present invention, so that it will be described together in the description provided for explaining the method and the apparatus for forming the solder bumps of the present invention.

Figure 1:
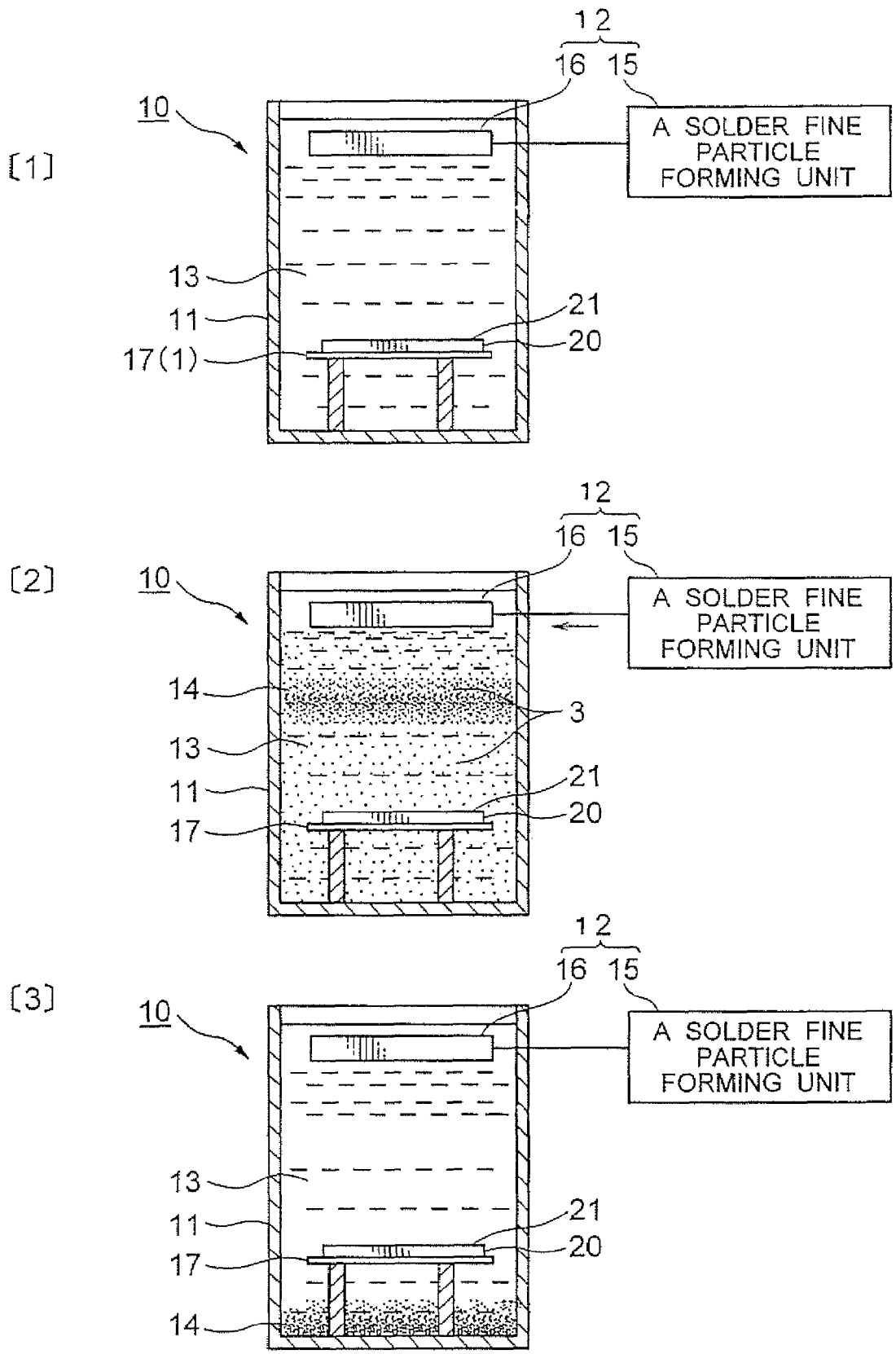
FIG. 1 are schematic block diagrams showing a first embodiment of a method and an apparatus used for forming solder bumps, in which the steps are carried out in order from FIG. 1 to FIG. 1.

FIG. 1 are schematic block diagrams showing a first embodiment of the method and the apparatus used for forming solder bumps, in which the steps are carried out in order from FIG. 1 to FIG. 1. Description will be provided in the followings by referring to the drawings.

A forming apparatus 10 used in the embodiment will be described. The forming apparatus 10 comprises a liquid tank 11 and a solder fine particle supplying means 12. The liquid tank 11 encloses an inert liquid 13 as a liquid which is heated to be hotter than the melting point of solder and a substrate 20 which is positioned in the inert liquid 13 with a surface 21 facing up. The solder fine particle supplying means 12 comprises a solder fine particle forming unit 15 for supplying solder fine particles 14 made of molten solder into the inert liquid 13 and a supply pipe 16 for dropping the solder fine particles 14 on the substrate 20.

Examples of the solder to be used are Sn—Pb (melting point at 183° C.), Sn—Ag—Cu (melting point at 218° C.), Sn—Ag (melting point at 221° C.), Sn—Cu (melting point at 227° C.), etc. The inert liquid 13 may be any types of liquid as long as it has a boiling point higher than the melting point of the solder and that it does not react to the solder (for example, fluorinated high boiling point solvent, fluorinated oil and the like). The liquid tank 11 is obtained by placing an electric heater and a coolant and the like (not shown) for keeping the inert liquid 13 higher than the melting point of the solder (for example, melting point +50° C.) in a container made of, for example, stainless, heat-resistant resin and the like. Further, inside the liquid tank 11, a mount 17 is provided for positioning the substrate 20 in the inert liquid 13.

The solder fine particle forming unit 15 is for forming the solder fine particles 14 by, for example, breaking the molten solder in the inert liquid 13. In this case, a laying pipe, which is for taking-in the solder fine particles 14 (molten solder) sunk in the bottom of the liquid tank 11 and the inert liquid 13 inside the liquid tank 11, may be provided in between the liquid tank 11. In the supply pipe 16, for example, a large number of supply ports (not shown) are provided from an edge to the other edge, and the solder fine particles 14 are dropped uniformly from the supply ports into the inert liquid 13. Thereby, the solder fine particles 14 mixed in the inert liquid 13 are fed out through the solder fine particle forming unit 15 and dropped into the inert liquid 13 inside the liquid tank 11 from the supply pipe 16.

FIG. 2 are fragmentary enlarged views of FIG. 1, in which FIG. 2 to FIG. 2 correspond to FIG. 1 to FIG. 1, respectively. Description will be provided in the followings by referring to the drawings. Description of the same components as those of FIG. 1 will be omitted by applying the same reference numerals thereto. FIG. 2 are more enlarged in vertical direction than in the lateral direction.

First, the substrate 20 used in the embodiment will be described. The substrate 20 is a silicon wafer. On the surface 21 of the substrate 20, pad electrodes 22 are formed. On the pad electrodes 22, solder bumps 23 are formed by the forming method of the embodiment. The substrate 20 is electrically and mechanically connected to other semiconductor chips and wiring boards through the solder bumps 23. The shape of the pad electrode 22, for example, is a circular shape and has a diameter c of, for example, 40 µm. A distance d between the centers of the adjacent pad electrodes 22 is 80 µm, for example. A diameter b of the solder fine particles 14 is, for example, 3 to 15 µm.

The pad electrode 22 is made of an aluminum electrode 24 formed on the substrate 20, a nickel layer 25 formed on the aluminum electrode 24, and a gold metal layer 26 formed on the nickel layer 25. The nickel layer 25 and the gold metal layer 26 are UBM (under barrier metal or under bump metallurgy) layers. The part of the substrate 20 other than the area of the pad electrodes 22 is covered by a protective film 27.

Next, the forming method of the pad electrodes 22 will be described. First, the aluminum electrode 24 is formed on the substrate 20 and the protective film 27 is formed by polyimide resin in the part where the aluminum electrode 24 is not formed. These are formed, for example, by photolithography and etching. Then, after applying a zincate treatment on the surface of the aluminum electrode 24, the nickel layer 25 and the gold metal layer 26 are formed on the aluminum electrode 24 by using electroless plating. The UBM layer is provided for giving the solder wetability to the aluminum electrode 24.

Next, the function and effect of the method and the apparatus for forming the solder bumps according to the embodiment will be described by referring to FIG. 1 and FIG. 2.

First, as show in FIG. 1 and FIG. 2, in the inert liquid 13 in the liquid tank 11, the substrate 20 is positioned with the surface 21 facing up. The pad electrodes 22 are formed on the surface 21 of the substrate 20. The inert liquid 13 is heated to be hotter than the melting point of the solder.

Subsequently, as shown in FIG. 1 and FIG. 2, the inert liquid 13 containing the solder fine particles 14 is fed from the solder fine particle forming unit 15 to the liquid tank 11 and the solder fine particles 14 are dropped from the supply pipe 16 onto the substrate 20 in the inert liquid 13.

In the inert liquid 13, the substrate 20 is immersed with the electrode pad 22 side facing up. At this time, when the solder fine particles 14 are supplied into the inert liquid 13 above the substrate 20, the solder fine particles 14 naturally fall down by the gravity, thereby reaching the substrate 20. The solder fine particles 14 reached on the pad electrodes 22 on the substrate 20 stay there due to the gravity, and spread on the surface of the pad electrodes 22 after the solder wet time for forming solder coating 23'. Then, the solder fine particles 14 reached on the solder coating 23' stays there due to the gravity, and also spread for thickening the solder coating 23' after the solder wet time as well. These actions are repeated and the solder coating 23' is grown to be the solder bump 23 (FIG. 1 and FIG. 2).

The solder wet time is the time by which the solder fine particles 14 and the pad electrodes 22 or the solder coating 23' come to be in contact, i.e. the time necessary for the solder to be wet (for example several seconds to some ten seconds), which is found by the Inventor of the present invention. In the embodiment, when the solder fine particles 14 fall down and reach the pad electrodes 22 or the solder coating 23', the solder fine particles 14 stay there due to the effect of the gravity. Thus, the solder fine particles 14 and the pad electrodes 22 or the solder coating 23' are to be in contact until the solder wet time has passed. Therefore, the solder wetability is excellent.

Further, the Inventor has found out that there are not many solder fine particles 14 which are combined for forming larger solder fine particles even if when the solder fine particles 14 come in contact with each other in the inert liquid 13. Therefore, solder bridges and the like are not generated even in the pad electrodes 22 formed with a fine pitch. Especially, it is better to make the diameter b of the solder fine particle 14 smaller than a shortest distance a between peripheral edges of the adjacent pad electrodes 22. In this case, the solder fine particles 14 which respectively reached on the two adjacent pad electrodes 22 do not come in contact, so that they are not combined for forming the solder bridge.

Further, the solder amount in the solder bump 23 can be easily controlled through changing the supply amount of the solder fine particles 14 by the solder fine particle forming unit 15. Moreover, since the solder fine particle 14 is extremely smaller than the pad electrode 22, a large amount of the solder fine particles 14 are supplied so as to be uniformly dispersed in the inert liquid 13. Therefore, there is a less difference in the solder amount of the solder bumps 23.

Figure 3:
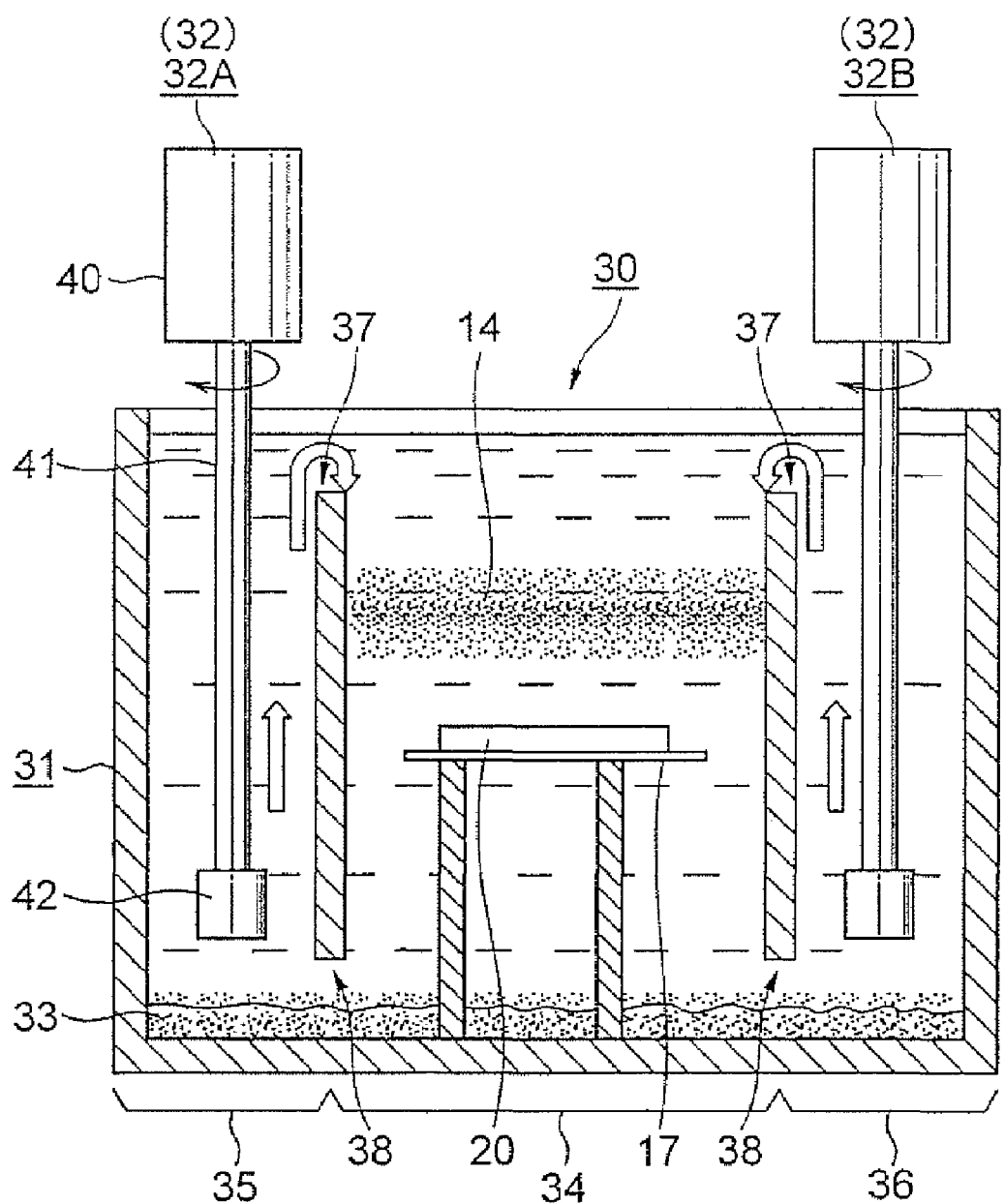
FIG. 3 is a schematic block diagram showing a second embodiment of a method and an apparatus used for forming solder bumps.
Figure 4:
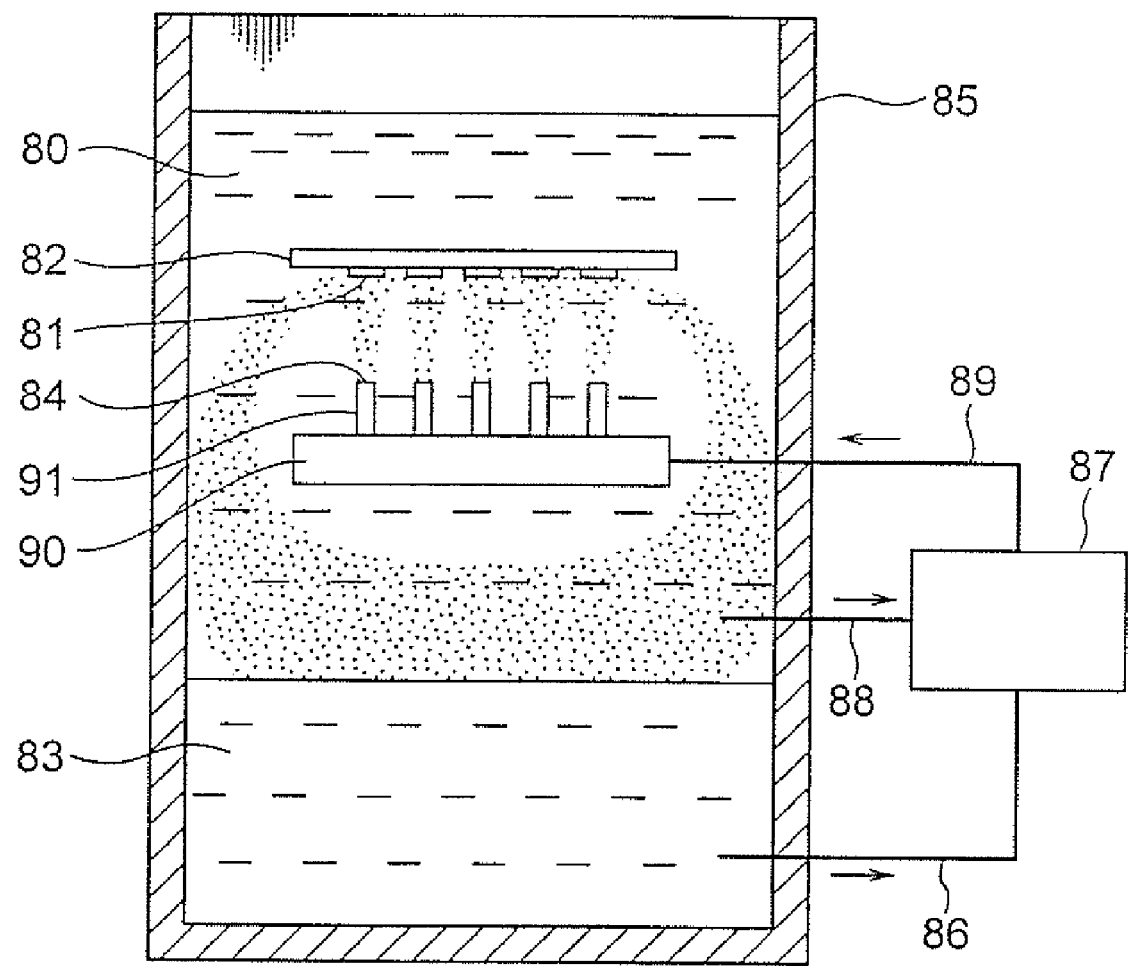
FIG. 4 is a schematic block diagram showing a conventional solder bump forming method.

FIG. 3 is a schematic block diagram for showing a second embodiment of the method and the apparatus for forming the solder bumps according to the present invention. Description will be provided in the followings by referring to the drawing. Description of the same components as those of FIG. 1 and FIG. 2 will be omitted by applying the same reference numerals thereto.

In a solder bump forming apparatus 30 of the embodiment, a liquid tank 31 and a solder fine particle supplying means 32 are in the configurations as follows. The liquid tank 31 comprises: a liquid tank 34 for enclosing a substrate 20, an inert liquid 13, and molten solder 33 sunk in the inert liquid 13; and liquid tanks 35, 36 for enclosing the inert liquid 13, and the molten solder 33 sunk in the inert liquid 13. The liquid tank 34 and the liquid tanks 35, 36 communicate with each other through upper sections 37 and bottom sections 38.

The solder fine particle supplying means 32 comprises agitators 32A, 32B placed in the liquid tanks 35, 36. It forms the solder fine particles 14 by breaking the molten solder 33 inside the liquid tanks 34 to 36, while supplying the solder fine particles 14 into the liquid tank 34 from the upper sections 37 of the liquid tanks 35, 36 for reutilizing the solder fine particles 14 sunk in the bottom section 38 of the liquid tank 34 as the molten solder 33.

Next, the action of the forming apparatus 30 will be described. The agitators 32A, 32B have the same configuration so that only the agitator 32A will be described.

The agitator 32A is placed in the liquid tank 35 and comprises a motor 40, a rotating shaft 41, an impeller 42, and the like. When the motor 40 rotates, the impeller 42 is also rotated through the rotating shaft 41. Upon this, the impeller 42 generates a flow of the inert liquid 13 which circulates inside the liquid tanks 34, 35. Then, the molten solder 33 inside the liquid tank 35 is caught in the flow and broken by the impeller 42 to be the solder fine particles 14 for being supplied into the liquid tank 34 from the upper section 37.

The process of forming the solder bumps (not shown) by the solder fine particles 14 is the same as that of the first embodiment. In the meantime, the solder fine particles 14 which did not form the solder bumps sink in the bottom section 38 inside the liquid tank 34. The liquid tank 34 and the liquid tank 35 communicate with each other through the bottom sections 38, so that the deposited solder fine particles 14 are broken to be the molten solder 33 and utilized again as the solder fine particles 14. Therefore, the solder can be effectively utilized.

The space between the liquid tank 34 and the liquid tank 35 may be shut so that they do not communicate with each other through the bottom sections 38. In this case, the solder fine particles 14 are not reutilized. Therefore, the quality of the solder fine particles 14 is improved and the size of the solder fine particles 14 becomes more uniform.

Needless to say, the present invention is not limited the first and the second embodiments described above. For example, instead of a silicon wafer (FC), a wiring board (BGA) may be used. Further, flux or the above-described organic acid may be contained in the inert liquid, or the above-described organic acid may be used instead of the inert liquid. Moreover, the electrode material is not limited to aluminum but Al—Si, Al—Si—Cu, Al—Cu, Cu, or the like may be used. Furthermore, after removing the oxide film of the solder fine particles by, for example, hydrochloric acid, the solder fine particles may be introduced into the liquid.

INDUSTRIAL APPLICABILITY

With the solder supplying method according to the present invention, by forming a solder coating on a metal film by dropping solder fine particles on a substrate in a liquid which is heated to be hotter than the melting point of solder, the solder fine particles reached on the metal film can be kept there due to the gravity for the time longer than the solder wet time. Thereby, the solder wetability can be improved. Further, there are not many solder fine particles which are combined to be larger solder particles even if the solder fine particles come in contact with each other in the liquid, so that it enables to prevent solder bridges and the like from being formed in the metal films with a fine pitch. Furthermore, by changing the supply amount of the solder fine particles, the solder amount in the solder coating can be easily controlled. Moreover, since the solder fine particle is extremely small, a large amount of the solder fine particles are supplied so as to be uniformly dispersed in the liquid. Therefore, the solder amount in the solder coating can be made uniform. As a result, it enables to obtain the metal films with the fine pitch and also enables to obtain the solder coating with a large amount of solder and a less difference in the amount.

With the solder supplying method according to at least the second aspect of the present invention, for example, by keeping the solder fine particles which are in contact on the metal film or the solder coating in that state for longer than the solder wet time, it is possible to surely cause the solder wet.

With the solder supplying method according to at least the third aspect of the present invention, for example, by dropping on a substrate the solder fine particles which have the falling speed within a specific range, only the solder fine particles in an appropriate size can be used. Therefore, it is possible to suppress generation of the solder bridges and deterioration of the solder wetability due to the oxide film.

With the method and the apparatus for forming the solder bumps according to the present invention, by forming the solder bumps on the pad electrodes through dropping the solder fine particles on the substrate in the liquid which is heated to be hotter than the melting point of the solder, the solder fine particles reached on the pad electrodes can be kept there due to the gravity for the time longer than the solder wet time. Thereby, the solder wetability can be improved. Further, there are not many solder fine particles which are combined to be larger solder fine particles even if the solder fine particles come in contact with each other in the liquid, so that it enables to prevent solder bridges and the like from being formed in the pad electrodes with a fine pitch. Furthermore, by changing the supply amount of the solder fine particles, the solder amount in the solder bumps can be easily controlled. Moreover, since the solder fine particle is extremely smaller than the pad electrodes, a large amount of the solder fine particles are supplied so as to be uniformly dispersed in the liquid. Therefore, the solder amount in the solder bumps can be made uniform. As a result, it enables to obtain the pad electrodes with a fine pitch and also enables to obtain the solder bumps with a large amount of solder and a less difference in the amount.

With the method and the apparatus for forming the solder bumps according to the present invention, by forming the solder fine particles through breaking the molten solder in the liquid, the solder fine particles and the solder bumps can be formed in a common liquid. Thereby, the configuration of the forming apparatus can be simplified.

In the method and the apparatus for forming the solder bumps according to the present invention, flux or the above-described organic acid is contained in the liquid, or the liquid is made of the organic acid, so that the solder wetability in the liquid can be more improved.

With the method and the apparatus for forming the solder bumps according to the present invention, by making the diameter of the solder fine particle smaller than the shortest distance between the peripheral edges of the adjacent pad electrodes, it enables to avoid the contact between the solder fine particles which reached respectively on the two adjacent electrode pads. Thereby, it is possible to more surely prevent the solder bridges from being formed.

In the apparatus for forming the solder bumps according to the present invention, for example, by not connecting the bottom section of the first liquid tank for forming the solder bumps on the substrate and the bottom section of the second liquid tank for forming the solder fine particles, the solder fine particles which did not form the solder bumps are not reutilized. Thereby, it is possible to improve the quality of the solder fine particles and also to make the size of the solder fine particles uniform.

In the apparatus for forming the solder bumps according to an aspect of the present invention, for example, by connecting the bottom section of the first liquid tank for forming the solder bumps on the substrate and the bottom section of the second liquid tank for forming the solder fine particles, the solder fine particles which did not form the solder bumps can be reutilized. Thereby, the solder can be effectively utilized without a waste.

What is claimed is:

1. A solder supplying method for forming solder coating on a metal film comprising:

positioning a substrate, having the metal film on a surface, with the surface facing up in a liquid which is heated to be hotter than a melting point of the solder; and dropping solder fine particles toward the substrate so that particles having a predetermined size reach the substrate when the falling speeds of the solder fine particles are within a specific time period, the specific time period being defined to exclude solder fine particles both larger and smaller than the predetermined size.

2. The solder supplying method according to claim 1, wherein the solder fine particles, which are dropped and come in contact with the metal film or the solder coating, are kept in contact with either one of the metal film or the solder coating for a certain time until solder wetting occurs.

3. A solder bump forming method for forming a solder bump on a pad electrode comprising:

positioning a substrate having the pad electrode on a surface with the surface facing up in a liquid which is heated to be hotter than a melting point of the solder;

melting the solder;

supplying solder fine particles made of melted solder into the liquid; and dropping the solder fine particles toward the substrate so that particles having a predetermined size reach the substrate when the falling speeds of the solder fine particles are within a specific time period, the specific time period being defined to exclude solder fine particles both larger and smaller than the predetermined size.

4. The solder bump forming method according to claim 3, wherein the solder fine particles are supplied on the substrate after forming the solder fine particles in advance by breaking the solder with a solder fine particle forming unit.

5. The solder bump forming method according to claim 3, wherein flux is contained in the liquid.

6. The solder bump forming method according to claim 3, wherein an organic acid is contained in the liquid or the liquid is made of the organic acid, wherein the organic acid has a reduction effect which removes an oxide on a metal surface.

7. The solder bump forming method according to claim 3, wherein a diameter of the solder fine particle is smaller than a minimum distance between the pad electrodes.

8. The solder supplying method according to claim 1, wherein the metal film is covered with gold.

* * * * *